United States Patent [19]
Kawamoto et al.

[11] Patent Number: 5,716,908
[45] Date of Patent: Feb. 10, 1998

[54] PROCESS FOR CONTROLLING CRYSTALLINE ORIENTATION OF OXIDE SUPERCONDUCTIVE FILM

[75] Inventors: Koji Kawamoto, Susono; Izumi Hirabayashi, Nagoya, both of Japan

[73] Assignees: Toyota Jidosha Kabushiki Kaisha, Aichi-ken; Superconductivity Research Laboratory of International Superconductivity Technology Center, Tokyo, both of Japan

[21] Appl. No.: 552,146

[22] Filed: Nov. 2, 1995

[30] Foreign Application Priority Data

Apr. 27, 1995 [JP] Japan ................. 7-104396

[51] Int. Cl.⁶ ................................. B05D 3/02
[52] U.S. Cl. ................ 505/500; 505/501; 505/473; 505/474; 505/475; 505/480; 505/729; 505/742; 427/62
[58] Field of Search ................ 505/500, 501, 505/729, 742, 473, 474, 475, 480; 427/62, 63

[56] References Cited

FOREIGN PATENT DOCUMENTS

| | | |
|---|---|---|
| 1-183480 | 7/1989 | Japan. |
| 5-78199 | 3/1993 | Japan. |
| 6-9296 | 1/1994 | Japan. |

OTHER PUBLICATIONS

"Oxygen ordering and transformation from a–axis oriented to b–axis oriented films in $YBa_2Cu_3O_y$" by K. Kawamoto and I. Hirabayashi, (an offprint from Advances In Superconductivity VII", by K. Yamafuji and T. Morishita), Proceedings of the 7th International Symposium on Superconductivity (ISS '94), Nov. 8–11, 1994, Kitakyushu, pp. 999–1002.

*Primary Examiner*—Roy V. King
*Attorney, Agent, or Firm*—Finnegan, Henderson, Farabow, Garrett & Dunner, L.L.P.

[57] ABSTRACT

A process for controlling crystalline orientation of an oxide superconductive film includes a first-heat-treatment step, and a second-heat-treatment step. In the first-heat-treatment step, an oxide superconductive film is heated and held in non-oxidizing atmosphere. Accordingly, partial oxygen deficiency is caused in the oxide superconductive film. In the second-heat-treatment step, the oxide superconductive film is heated and held in oxygen-rich atmosphere. Consequently, oxygen is re-introduced into the oxide superconductive film. Thus, crystalline orientation of the oxide superconductive film is altered. The process enables to readily form not only an "a"-axis-oriented oxide superconductive film but also a "b"-axis-oriented oxide superconductive film.

28 Claims, 5 Drawing Sheets

PROCESS FOR CONTROLLING CRYSTALLINE ORIENTATION OF OXIDE SUPERCONDUCTIVE FILM

BACKGROUND OF THE INVENTION

1. Field of the Invention

The present invention relates to a process for controlling crystalline orientation of an oxide superconductive film.

2. Description of Related Art

Oxide superconductive film has drawn attention of engineers, because its critical temperature ($T_c$) is increasing. As for oxide superconductive film, there has been known one having a composition, which is expressed by a chemical formula, $LM_2Cu_3O_7$. In the chemical formula, "L" means yttrium (Y), and lanthanide elements free from cerium (Ce) and promethium (Pm), and "M" means barium (Ba) and strontium (Sr). Such oxide superconductive film can be represented by $YBa_2Cu_3O_y$ (hereinafter abbreviated to "YBCO").

YBCO has been known that it can be produced by a variety of processes, such as a PVD process, a CVD process, a photo-irradiation MOCVD (Metalorganic Chemical Vapor Deposition) process, a molecular beam epitaxy (MBE) process and a laser ablation process. These processes are basically carried out by depositing the constituent elements, such as Y, Ba, Cu and O, in predetermined ratios on a substrate.

General speaking, YBCO exhibits superconductivity when it is orthorhombic (e.g., axial lengths of crystalline axes: $a \neq b \neq c$; and angles between crystalline axes: $\alpha = \beta = \gamma = 90°$), and it does not exhibit superconductivity when it is tetragonal (e.g., axial lengths of crystalline axes: $a = b \neq c$; and angles between crystalline axes: $\alpha = \beta = \gamma = 90°$).

When current flows in oxide superconductive film, current density shows heavy anisotropy therein. For instance, it is believed that current density differs greatly in "a"-axis-oriented oxide superconductive film and in "b"-axis-oriented oxide superconductive film. It is thus believed that the physical properties of oxide superconductive film depend greatly on crystallization direction. For example, in many cases, "a"-axis-oriented oxide superconductive film and "b"-axis-oriented oxide superconductive film are superior to "c"-axis-oriented oxide superconductive film in terms of physical properties. In particular, it is very difficult to make laminated Josephson junction out of "c"-axis-oriented oxide superconductive film, because "c"-axis-oriented oxide superconductive film shows a coherence length as small as about 0.2 nm.

Japanese Unexamined Patent Publication (KOKAI) No. 5-78,199 discloses a technique for forming an "a"-axis-oriented oxide superconductive film or a (110)-oriented oxide superconductive film; namely: an oxide superconductive film is heated to a temperature of 400° C. or more; and it is cooled while it is brought into contact with active oxygen, such as oxygen radical.

Japanese Unexamined Patent Publication (KOKAI) No. 6-9,296 discloses another technique, which relates to a photo-irradiation MOCVD process, for forming an "a"-axis-oriented oxide superconductive film whose "c"-axis is parallel to a substrate; namely: an oxide superconductive film is deposited by a chemical vapor phase growing process while irradiating an ArF excimer laser beam having a wavelength of 193 nm onto an oxide superconductive film being deposited. In accordance with the technique, an "a"-axis-oriented oxide superconductive film is produced by irradiating the ArF excimer laser beam.

It is believed that devices like Josephson junction can be stabilized by using "b"-axis-oriented oxide film, because "b"-axis-oriented oxide superconductive film is less likely to cause oxygen deficiency than "a"-axis-oriented oxide superconductive film and "c"-axis-oriented oxide superconductive film, and because it is less likely to suffer from chronic change. Hence, "b"-axis-oriented oxide superconductive film, whose "b" axis orientation is high, has been desired than ever. In Apply. Phys. Lett61 (21), 1992, p2598, a technique for forming a "b"-axis-oriented oxide superconductive film is disclosed, in which a Gd123 film is formed on a (100) STO (i.e., $SrTiO_3$) substrate by a DC magnetron sputtering process.

In the engineering field of oxide superconductive film, an "a"-axis-oriented oxide superconductive film means a film whose "a"-axis is largely oriented perpendicularly to a substrate, for example, by 70% or more. Further, a "b"-axis-oriented oxide superconductive film means a film whose "b"-axis is largely oriented perpendicularly to a substrate, for example, by 70% or more. Furthermore, a "c"-axis-oriented oxide superconductive film means a whose "c"-axis is largely oriented perpendicularly to a substrate, for example, by 70% or more. Here, "b"-axis means a direction in which its axial length is larger than an axial length of "a"-axis (i.e., "a"<"b") when O atoms are arranged between Cu atoms in Cu (I)—O basal plane of crystalline structure.

One can expect to form an "a"-axis-oriented oxide superconductive film by the technique disclosed in Japanese Unexamined Patent Publication (KOKAI) No. 5-78,199. However, the "a"-axis orientation cannot necessarily develop to a satisfactory extent; namely: an "a"-axis-oriented oxide superconductive film of high quality cannot be produced.

Further, a "b"-axis-oriented oxide superconductive film cannot be produced by the technique disclosed in Japanese Unexamined Patent Publication (KOKAI) No. 6-9,296.

Furthermore, one can expect to form a "b"-axis-oriented oxide superconductive film by the technique disclosed in Apply. Phys. However, the "b"-axis orientation cannot necessarily develop to a satisfactory extent; namely: a "b"-axis-oriented oxide film of high quality cannot be produced.

SUMMARY OF THE INVENTION

The present invention has been developed in view of the aforementioned circumstances. It is therefore a first object of the present invention to provide a process for controlling crystalline orientation of an oxide superconductive film, process which can advantageously alter crystalline orientation of an oxide superconductive film.

It is a second object of the present invention to provide a process for controlling crystalline orientation of an oxide superconductive film, process which can beneficially prepare an oxide superconductive film of high "b"-axis orientation.

It is a third object of the present invention to provide a process for controlling crystalline orientation of an oxide superconductive film, process which can beneficially prepare an oxide superconductive film of much higher "b"-axis orientation.

It is a fourth object of the present invention to provide a process for controlling crystalline orientation of an oxide superconductive film, process which can advantageously prepare an oxide superconductive film of high "a"-axis orientation.

When oxygen atoms leave from oxide superconductive film and the oxygen deficiency increases therein, the superconductivity of the film deteriorates. Accordingly, researches and developments have been under way so that oxide superconductive film is oxidized at high efficiency.

The inventors of the present invention developed oxide superconductive film diligently, they focused on $YBa_2Cu_3O_y$ superconductive film. They conceived a process for producing the film from different perspective. As a result, when the oxygen atoms are forcibly expelled from the film by a heat treatment to cause oxygen deficiency and thereafter oxygen atoms are re-introduced thereinto by a further heat treatment in oxygen-rich atmosphere, they discovered that the crystalline axes of the film are transformed so as to alter the crystalline orientation. They also verified this fact by a series of experiments.

For instance, when "a"-axis-oriented superconductive film or oxide superconductive film, in which "a"-axis and "b"-axis coexist, are subjected to a heat treatment, the heat treatment forcibly expels the oxygen atoms therefrom to cause oxygen deficiency therein, and adjusts the oxygen deficiency "x" to be $0.4 \leq$"x"$<0.8$. Thereafter, when it is subjected to a further heat treatment in oxygen-rich atmosphere, the further heat treatment re-introduces oxygen atoms thereinto, and transforms the orientation of the film into "b"-axis orientation.

In accordance with the aforementioned discoveries, the present inventors completed the present invention, a novel process for controlling crystalline orientation of an oxide superconductive film.

It is not clear at this moment what mechanism governs the phenomena described above. It is assumed, however, that the oxygen atoms are re-arranged in the Cu (I)—O basal plane when the oxygen atoms are expelled from and re-introduced into the Cu (I)—O basal plane, and the direction of the re-arrangement depends on the degree of oxygen deficiency.

A first embodiment of the present invention is a process for controlling crystalline orientation of an oxide superconductive film by subjecting the oxide superconductive film to heat treatment, The process comprises the steps of:

carrying out a first heat treatment, in which the oxide superconductive film is heated and held in non-oxidizing atmosphere, thereby causing partial oxygen deficiency in the oxide superconductive film; and carrying out a second heat treatment, in which the oxide superconductive film is heated and held in oxygen-rich atmosphere, thereby re-introducing oxygen into the oxide superconductive film and altering crystalline orientation of the oxide superconductive film.

In the first embodiment, it is assumed that the crystalline orientation of the oxide superconductive film can be altered, because the oxygen atoms are expelled from the film by the first heat treatment, and because the oxygen atoms are re-arranged in the film when the oxygen atoms are again introduced into the film by the second heat treatment.

In accordance with the first embodiment, the crystalline orientation of the oxide superconductive film can be controlled beneficially; namely: depending on devices to be prepared, not only an "a"-axis-oriented oxide superconductive film, but also a "b"-axis-oriented superconductive film can be formed readily.

A second embodiment of the present invention is a process for controlling crystalline orientation of an oxide superconductive film. The process comprises the steps of:

forming an oxide superconductive film on a substrate, the oxide superconductive film expressed by a chemical formula, $LM_2Cu_3O_{7-x}$, in which "L" is at least one element selected from the group consisting of Y and lanthanide elements free from Ce and Pm, and "M" is at least one element selected from the group consisting of Ba and Sr, and the oxide superconductive film having "c"-axis, which is parallel to the substrate;

carrying out a first heat treatment, in which the oxide superconductive film is heated and held in non-oxidizing atmosphere, thereby causing partial oxygen deficiency in the oxide superconductive film so that oxygen deficiency "x" is $0.4 \leq$"x"$<0.8$; and carrying out a second heat treatment, in which the oxide superconductive film is heated and held in oxygen-rich atmosphere, thereby re-introducing oxygen into the oxide superconductive film and preparing a "b"-axis-oriented oxide superconductive film.

In the second embodiment, it is assumed that the oxide superconductive film can be altered to the "b"-axis-oriented oxide superconductive film, because the oxygen atoms are expelled from the film by the first heat treatment so as to induce oxygen deficiency "x" to be $0.4 \leq$"x"$<0.8$, and because the oxygen atoms are re-arranged in the film so as to be perpendicular to the substrate when the oxygen atoms are again introduced into the film by the second heat treatment.

In accordance with the second embodiment, an oxide superconductive film of high "b"-axis orientation can be produced. For instance, depending on devices to be prepared, a "b"-axis-oriented superconductive film can be formed advantageously.

In the second embodiment, the first heat treatment can be carried out in a temperature range of from 300° to 450° C., and the "b"-axis orientation of the resulting oxide superconductive film can be 70% or more after the second heat treatment.

As a result, in the thus modified version of the second embodiment, an oxide superconductive film whose "b"-axis orientation is furthermore enhanced can be produced by controlling the temperature of the first heat treatment. It is assumed that the rearrangement of the oxygen atoms are likely to be influenced by the temperature of the first heat treatment.

In accordance with the modified version of the second embodiment, an oxide superconductive film of much higher "b"-axis orientation, can be produced. For example, the "b"-axis orientation of the thus produced oxide superconductive film can be 90% or more, or even 95% or more.

A third embodiment of the present invention is a process for controlling crystalline orientation of an oxide superconductive film. The process comprises the steps of:

forming an oxide superconductive film on a substrate, the oxide superconductive film expressed by a chemical formula, $LM_2Cu_3O_{7-x}$, in which "L" is at least one element selected from the group consisting of Y and lanthanide elements free from Ce and Pro, and "M" is at least one element selected from the group consisting of Ba and Sr, and the oxide superconductive film having "c"-axis, which is parallel to the substrate;

carrying out a first heat treatment in which the oxide superconductive film is heated and held in non-oxidizing atmosphere, thereby causing partial oxygen deficiency in the oxide superconductive film so that oxygen deficiency "x" is $0.8 \leq$"x"$\leq 1.0$; and carrying out a second heat treatment, in which the oxide superconductive film is heated and held in oxygen-rich atmosphere, thereby re-introducing oxygen into the oxide superconductive film and preparing an "a"-axis-oriented oxide superconductive film.

In the third embodiment, it is assumed that the oxide superconductive film can be altered to the "a"-axis-oriented oxide superconductive film, because the oxygen atoms are expelled from the film by the first heat treatment so as to induce oxygen deficiency "x" to be $0.8 \leq "x" \leq 1.0$, and because the oxygen atoms are re-arranged in the film so as to be parallel to the substrate when the oxygen atoms are again introduced into the film by the second heat treatment.

In accordance with the third embodiment, an oxide superconductive film of high "a"-axis orientation can be produced. For instance, depending on devices to be prepared, an "a"-axis-oriented superconductive film can be formed advantageously.

BRIEF DESCRIPTION OF THE DRAWINGS

A more complete appreciation of the present invention and many of its advantages will be readily obtained as the same becomes better understood by reference to the following detailed description when considered in connection with the accompanying drawings and detailed specification, all of which forms a part of the disclosure.

DETAILED DESCRIPTION OF THE PREFERRED EMBODIMENTS

Having generally described the present invention, a further understanding can be obtained by reference to the specific preferred embodiments which are provided herein for purposes of illustration only and are not intended to limit the scope of the appended claims.

The following preferred embodiments are applications of the present invention to an oxide superconductive film which is expressed by a chemical formula, $YBa_2Cu_3O_y$, wherein "y"=7. As earlier mentioned, $YBa_2Cu_3O_y$ having superconductivity is said to be orthorhombic. When an oxide superconductive film is expressed by a chemical formula, $YBa_2Cu_3O_{y-x}$, "x" means oxygen deficiency. When oxygen deficiency increases, "b"-axis lacks oxygen atoms, and its axial length approaches to that of "a"-axis. Thus, an orthorhombic system is believed to come closer to a tetragonal system, or an orthorhombic system is believed to transform into a tetragonal system.

FIRST PREFERRED EMBODIMENT (Photo-irradiation MOCVD Apparatus Employed)

Figure 1:
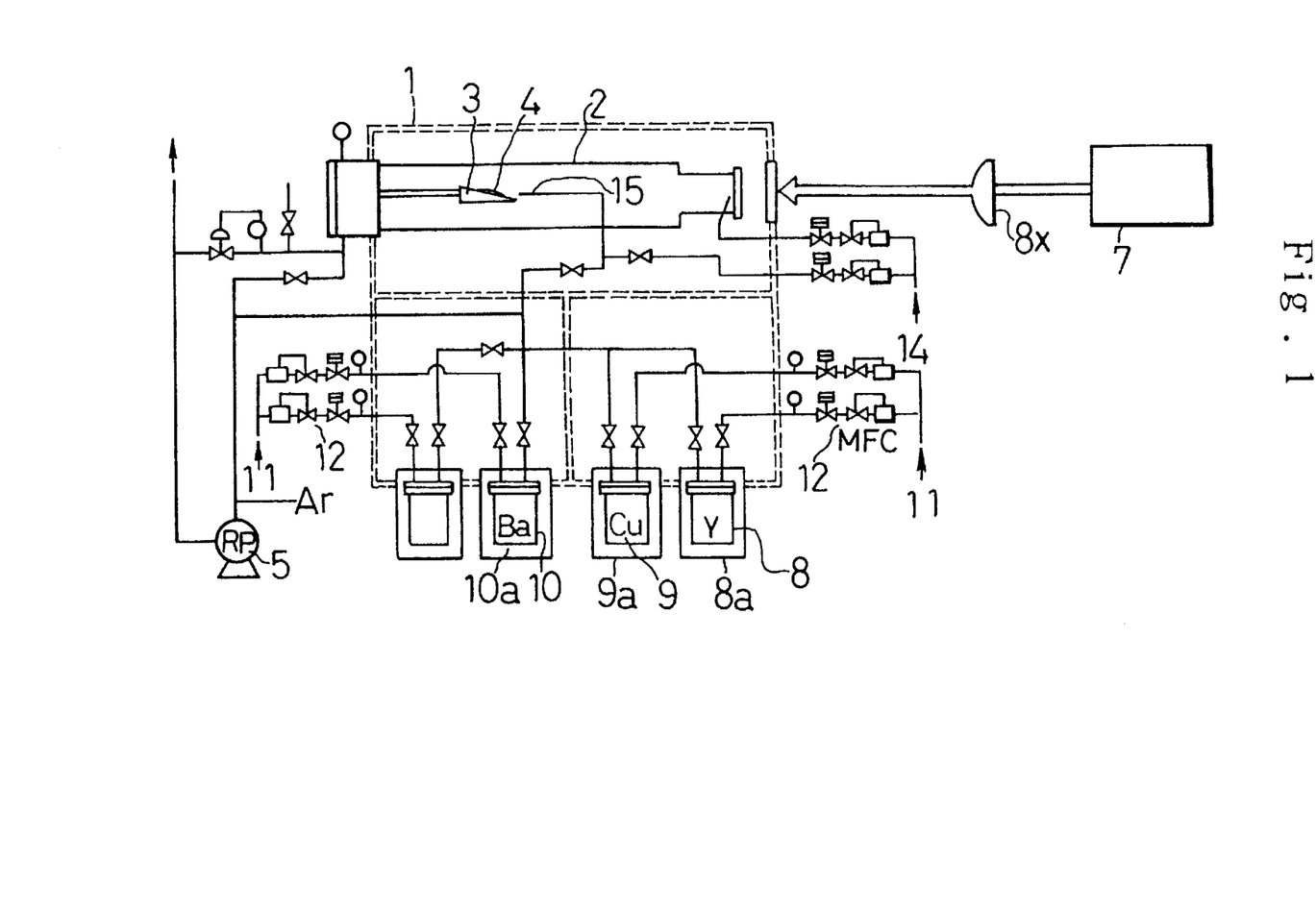
FIG. 1 is a schematic construction diagram of an apparatus, which is employed in a photo-irradiation MOCVD process.

FIG. 1 illustrates an apparatus employed in the First Preferred Embodiment. This apparatus is one adapted for a photo-irradiation MOCVD process. In this apparatus, a reactor tube 2 is held in an oven 1. At a predetermined position in the reactor tube 2, there is disposed a mantle heater 3, which is adapted for heating a substrate. A substrate 4 is held on the mantle heater 3, and has a size of 10 mm×10 mm (i.e., a surface area of 100 mm²). In particular, the substrate 4 is inclined by a predetermined angle with respect to the central axis of the reactor tube 2. An evacuating pump 5 evacuates the inside of the reactor tube 2.

Further, an ultraviolet beam source 7 is disposed in this apparatus, and emits an ArF excimer laser beam having a wavelength of 193 nm. A laser beam emitted from the ultraviolet beam source 7 is collected by a cylindrical lens 8x, and is irradiated in the direction of the central axis of the reactor tube 2 via a quartz window of the reactor tube 2. Thus, the laser beam is irradiated onto the substrate 4 in the reactor tube 4.

Furthermore, raw material tubes 8, 9, 10 hold an organometallic complex raw material therein, respectively. In the raw material tubes 8, 9, 10, the organometallic complex raw materials are heated and vaporized by raw material heaters 8a, 9a, 10a. A carrier gas (e.g., an Ar gas) is introduced into the raw material tubes 8, 9, 10 via a carrier gas inlet port 11 and a flow meter 12. In the raw material tubes 8, 9, 10, the vaporized raw materials are diffused by the carrier gas, and mixed in predetermined ratios. The thus mixed gases are further mixed with an oxygen gas, which is supplied via an oxygen gas inlet port 14. The mixed gases are delivered into the reactor tube 2, and spouted in front of the substrate 3, which is held in the reactor tube 2, via a spouting port 15.

(Oxide Superconductive Film Preparation Process)

In the First Preferred Embodiment, the following diketone complexes were prepared as raw materials; namely: $Y(DPM)_3$, $Ba(DPM)_2$, and $Cu(DPM)_2$. "DPM" herein means dipybaloylmethane. $Y(DPM)_3$ was held in the raw material tube 8, $Ba(DPM)_2$ was held in the raw material tube 9, and $Cu(DPM)_2$ was held in the raw material tube 10. In the raw material tube 8, the raw material was heated at a temperature of 123° C., and mixed with the carrier gas which was supplied in a flow rate of 12.0 ccm. In the raw material tube 9, the raw material was heated at a temperature of 116° C., and mixed with the carrier gas which was supplied in a flow rate of 20.0 ccm. In the raw material tube 10, the raw material was heated at a temperature of 234° C., and mixed with the carrier gas which was supplied in a flow rate of 12.0 ccm. The oxygen gas was supplied in a flow rate of 80 ccm. In the First Preferred Embodiment, the raw materials were thus supplied so that a molar ratio, Y:Ba:Cu=1:2:3, was established. Note that the pressure was held at 3 Torr in the reactor tube 2 when preparing an oxide superconductive film.

Considering the lattice parameter, single crystal MgO (100) was employed for the substrate 4. Note that the substrate 4 was heated to 650° C.

An oxide superconductive film was prepared while scanning a growing film with a laser beam. The laser beam was produced under the following conditions; namely: an oscillator frequency was set at 20 Hz; and a laser power was adjusted to 100 mJ/cm$^2$. Note that the film preparation was carried out for 30 minutes.

Thus, an oxide superconductive film was formed on the substrate 4, and had a thickness of about 200 nm. Note that the film thickness was measured by an SEM (Scanning Electron Microscope) observation and an ICP (Inductively Coupled Plasma) analysis. The resulting oxide superconductive film had "c"-axis which was parallel to the substrate 4. Note that, however, the portions of the film where the laser beam was irradiated were turned into "a"-axis orientation. Thus, this film is an axis-oriented film. Also note that an oxide superconductive film, in which "a"-axis orientation and "b"-axis orientation coexist, can be prepared by the above-described film preparation process.

Figure 2:
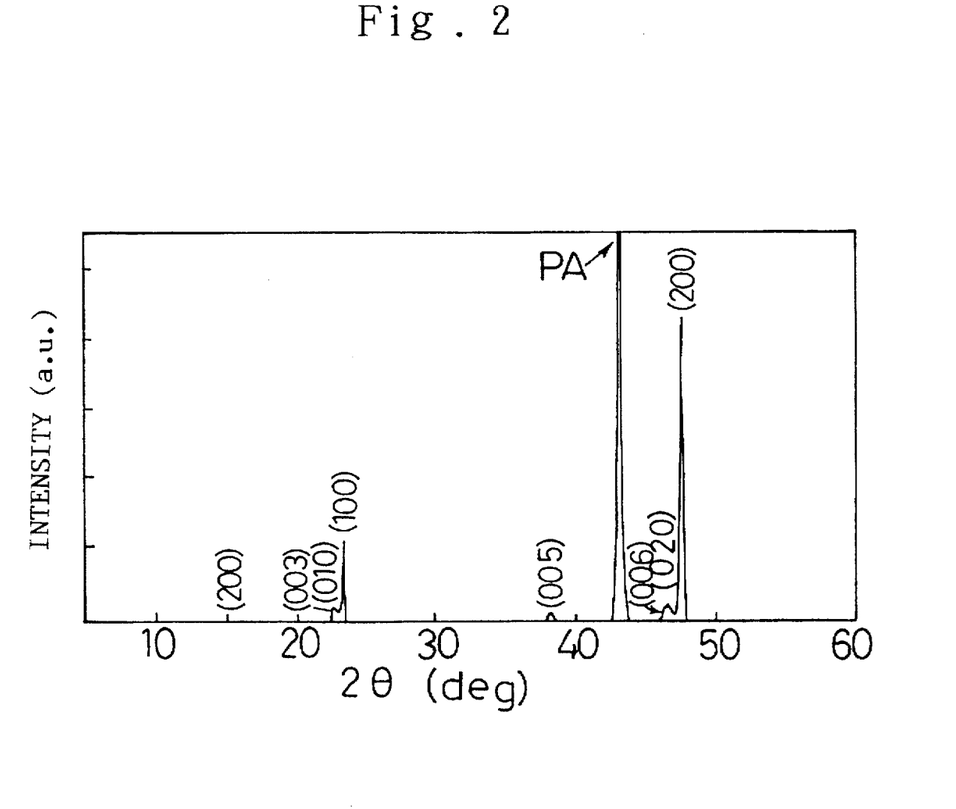
FIG. 2 is an X-ray diffraction chart on an "as-grown" oxide superconductive film.

The thus prepared oxide superconductive film (e.g., an "as-grown" film immediately after the film preparation) was subjected to an X-ray diffraction analysis. FIG. 2 illustrates an X-ray diffraction pattern on the "as-grown" film. As it can be appreciated from FIG. 2, there arise high-intensity peaks, which result from (h00) planes (e.g., (200) and (100) planes), and a low-intensity peak, which results from (0k0) planes (e.g., (020) plane). FIG. 2 suggests that the "as-grown" film prepared by the photo-irradiation MOCVD process was of high "a"-axis orientation, and that an "a"-axis-oriented film was prepared. Note that, in FIG. 2, "PA" specifies a peak of MgO in the substrate 4.

By carrying out the photo-irradiation MOCVD process as described above, the following oxide superconductive films were prepared; namely: a $YBa_2Cu_3O_{7-x}$ oxide superconductive film, in which "x" was 0.1 or less (i.e., "x"≦0.1), and, under certain circumstances, a $YBa_2Cu_3O_{7-x}$ oxide superconductive film, in which "x" was 0.2 or less (i.e., "x"≦0.2). With these oxygen deficiencies, the oxide superconductive films were orthorhombic.

(Heat Treatment Process)

A heat treatment process will be hereinafter described step by step. Specifically, first and second hat treatment steps constituted the heat treatment process, and they will be described independently.

(First Heat Treatment Step)

The substrate 4, on which the oxide superconductive film was prepared by the photo-irradiation MOCVD process as described above, was removed from the reactor tube 2, and disposed in a heat treatment oven. Then, a nitrogen gas of high purity (e.g., 99.999%) was supplied into the heat treatment oven, thereby establishing nitrogen atmosphere therein. Note that the nitrogen atmosphere included a trace amount of oxygen, and that the oxygen exhibited a partial pressure of $10^{-4}$ Torr. The substrate 4 and the oxide superconductive film were heated to 415° C. and held in the nitrogen atmosphere for 30 minutes. Thus, the film was subjected to a first heat treatment (e.g., annealing with nitrogen). Thereafter, the film was cooled down to a room-temperature range in the oven. The inventors of the present invention regard the principle object of this first heat treatment as means for causing oxygen deficiency.

By thus carrying out the first heat treatment, in the $YBa_2Cu_3O_{7-x}$ oxide superconductive film, the oxygen deficiency "x" was adjusted to fall in a range of from 0.4 to 0.8 (not inclusive) (i.e., 0.4≦"x"<0.8). When the chemical formula is expressed by $YBa_2Cu_3O_y$, the value "y" can be adjusted to fall in a range of from 6.2 (not inclusive) to 6.6 (i.e., 6.2<"y"≦6.6).

According to literature, the transition point, at which oxide superconductor changes from an orthorhombic system to a tetragonal system, is generally said to lie where the value "y" falls in a range of from 6.2 to 6.4. The "y" value naturally differs from a literature to another literature. Considering this fact, the oxide superconductive film, which was subjected to the first heat treatment, was orthorhombic, but was on its way to the transition point or lay in an area around the transition point.

Note that, however, it is possible to adjust the oxygen deficiency "x" so as to fall in a range of from 0.6 to 0.8 (not inclusive) (i.e., 0.6 ≦"x"<0.8) in a $YBa_2Cu_3O_{7-x}$ oxide superconductive film, which is immediately after being subjected to the first heat treatment.

(Second Heat Treatment Step)

After carrying out the first heat treatment, an oxygen gas of high purity (e.g., 99.99%) was supplied into the heat treatment oven, thereby establishing oxygen atmosphere therein. Note that the oxygen atmosphere had a pressure of 1 atm. The substrate 4 and the oxide superconductive film were heated to 500° C. and held in the oxygen atmosphere for 30 minutes. Thus, the film was subjected to a second heat treatment (e.g., annealing with oxygen). Thereafter, the film was cooled down to a room-temperature range in the oven. The inventors of the present invention regard the principle object of this second heat treatment as means for re-introducing oxygen into the film after causing the oxygen deficiency.

Figure 3:
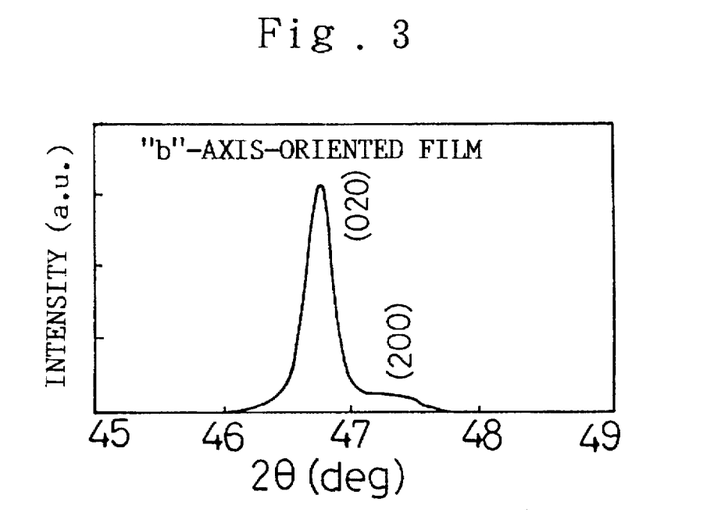
FIG. 3 is an X-ray diffraction chart on an oxide superconductive film, which was subjected to first and second heat treatments of a crystalline orientation controlling process according to a First Preferred Embodiment of the present invention.

The thus heat-treated oxide superconductive film was subjected to an X-ray diffraction analysis. FIG. 3 illustrates an X-ray diffraction chart on the heat-treated film. As can be appreciated from FIG. 3, there arises a high-intensity peak, which results from (020) plane. Thus, the heat-treated film exhibited a high-intensity peak, which resulted from (0k0) plane. This fact implies that the heat treatment produced an oxide superconductive film of high "b"-axis orientation. Moreover, as can be seen from FIG. 3, there arises a low-intensity peak, which results from (200) plane. Thus, the heat-treated film exhibited a low-intensity peak, which resulted from (h00) plane. This fact indicates that the heat-treated film was of low "a"-axis orientation.

Hence, it was verified by the X-ray diffraction analysis that the crystalline orientation was altered from "a"-axis orientation to orientation in the oxide superconductive film, which was subjected to the first and second heat treatments according to the First Preferred Embodiment.

By thus carrying out the second heat treatment, oxygen atoms were re-introduced into the Cu(I) —O bottom surface of the oxide superconductive film. Accordingly, in the heat-treated $YBa_2Cu_3O_{7-x}$ oxide superconductive film, the oxygen deficiency "x" was adjusted to be 0.1 or less (i.e., "x"≦0.1). Specifically, the oxide superconductive film was orthorhombic.

COMPARATIVE EXAMPLE NO. 1

As a comparative example, an oxide superconductive film as well as a substrate 4, which were identical with those prepared in the First Preferred Embodiment, were heated to 260° C. and held in nitrogen atmosphere for 30 minutes, thereby carrying out a comparative first heat treatment. Note that, except that the film and the substrate 4 were heated to 260° C., the other conditions of this comparative first heat treatment were identical with those of the first heat treatment of the First Preferred Embodiment.

Figure 4:
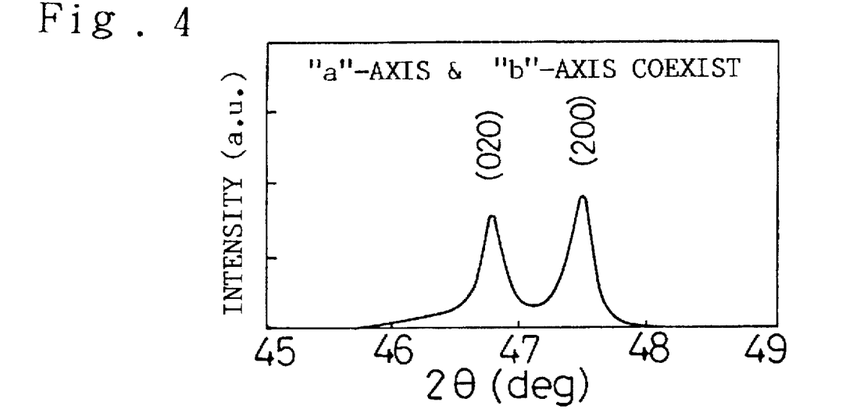
FIG. 4 is an X-ray diffraction chart on an oxide superconductive film, which was subjected to first and second heat treatments of a crystalline orientation controlling process according to Comparative Example No. 1.

Thereafter, the film and the substrate were heated to 500° C. and held in oxygen atmosphere for 30 minutes, thereby carrying out a comparative second heat treatment in the identical manner with that of the First Preferred Embodiment The resulting comparative oxide superconductive film was subjected to an X-ray diffraction analysis. FIG. 4 illustrates an X-ray diffraction chart on the comparative film. As can be appreciated from FIG. 4, there arise high-intensity peaks, which result from (020) plane and (200) plane. These two peaks exhibit virtually equal intensity. This fact implies that "a"-axis orientation and "b"-axis orientation coexisted in the comparative film. Thus, it was understood that no satisfactory "b"-axis orientation is produced when the heat treatment temperature is as low as 260° C. in the first heat treatment.

Experiment

Figure 5:
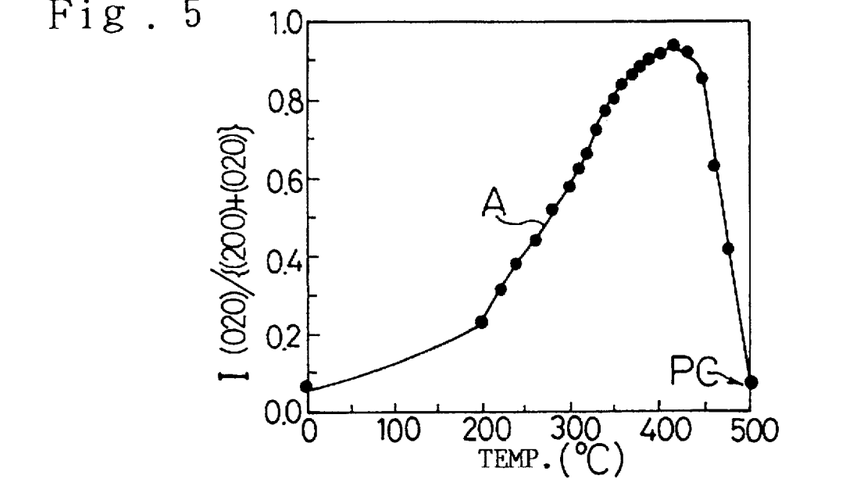
FIG. 5 is a graph, which shows a relationship between temperature of the first heat treatment and "b"-axis orientation.

Moreover, except that the heat treatment temperature was varied variously in the first heat treatment, an experiment was carried out under the same conditions as those of the First Preferred Embodiment. The resulting experimental oxide superconductive films were subjected to an X-ray diffraction analysis. FIG. 5 illustrates the results of the X-ray diffraction analysis as a "b"-axis orientation characteristic curve. For example, the horizontal axis of FIG. 5 specifies the heat treatment temperature in the first heat treatment, and the vertical axis thereof specifies the rate of the peak intensity resulting from (020) plane with respect to the total peak intensity resulting from (200) and (020) planes. Specifically, the vertical axis of FIG. 5 is expressed in I(020)/{(200)+(020)}. To summarize, the vertical axis of FIG. 5 specifies the rate of "b"-axis orientation. For instance, the "b"-axis orientation is 100% at 1.0 on the vertical axis of FIG. 5.

As can be seen from FIG. 5, the "b"-axis orientation characteristic curve, designated at "A" therein, showed the following critical property; namely; the "b"-axis orientation developed to a maximum area when the temperature, specified in the horizontal axis, was in a predetermined range. For example, the "b"-axis orientation increased sharply when the temperature went beyond 300° C. The rate of the "b"-axis orientation was increasing when the temperature was in a range of from 350° C. to 460° C. The rate of the "b"-axis orientation exceeded 90% when the temperature was in a range of from 370° C. to 440° C., and increased when the temperature was in a range of from 400° C. to 440° C. In particular, the rate of the "b"-axis orientation was maximized to about 95% when the temperature was around 415° C.

However, as can be understood from FIG. 5, the oxide superconductive films, which were formed under the same conditions as those of the First Preferred Embodiment, exhibited sharply decreasing "b"-axis orientation as the temperature of the first heat treatment approached to 500° C. For example, when the first heat treatment was carried out at around 470° C., the resulting oxide superconductive film exhibited "b"-axis orientation of less than 50%. When the first heat treatment was carried out at 500° C., the resulting oxide superconductive film exhibited "b"-axis orientation of less than 10%, and was substantially an "a"-axis-oriented oxide superconductive film. In short, when the first heat treatment was carried out at a higher temperature, the resulting oxide superconductive film exhibited a higher "a"-axis orientation. For instance, when the first heat treatment was carried out at 500° C., the resulting oxide superconductive film exhibited "a"-axis orientation of 95% approximately.

SECOND PREFERRED EMBODIMENT

(First Heat Treatment)

In the Second Preferred Embodiment, an oxide superconductive film, e.g., a YBCO superconductive film, was used, and was identical with that of the First Preferred Embodiment. Note that "c"-axis of this film was parallel to the substrate 4. This film was placed in the heat treatment oven together with the substrate 4. The nitrogen gas was supplied into the heat treatment oven to establish nitrogen atmosphere therein. Note that the nitrogen atmosphere included a trace amount of oxygen, and that the oxygen exhibited a partial pressure of $10^{-4}$ Torr. The oxide superconductive film was heated to 500° C. together with the substrate 4, and held in the nitrogen atmosphere for 30 minutes. Thus, the film was subjected to a first heat treatment (e.g., annealing with nitrogen).

After carrying out the first heat treatment, in the $YBa_2Cu_3O_{7-x}$ oxide superconductive film, the oxygen deficiency "x" was adjusted to fall in a range of from 0.8 to 1.0 (i.e., $0.8 \leq$"x"$\leq 1.0$). When the chemical formula is expressed by $YBa_2Cu_3O_y$, the value "y" can be adjusted to fall in a range of from 6.0 to 6.2 (i.e., $6.0 \leq$"y"$\leq 6.2$).

As earlier mentioned, the literature says that the transition point, at which oxide superconductor changes from an orthorhombic system to a tetragonal system, is generally said to lie where the value "y" falls in a range of from 6.2 to 6.4. Considering this fact, the oxide superconductive film, which was subjected to the first heat treatment, is tetragonal, or comes closer to a tetragonal system.

(Second Heat Treatment)

After carrying out the first heat treatment, an oxygen gas was supplied into the heat treatment oven to establish oxygen atmosphere therein. Note that the oxygen atmosphere had a pressure of 1 atm. The oxide superconductive film was heated to 500° C. together with the substrate 4, and held in the oxygen atmosphere for 30 minutes. Thereafter, the film was cooled down to a room-temperature range in the oven. Note that the nitrogen and oxygen gases, which were employed in the first and second heat treatments of the Second Preferred Embodiment, were identical with those employed in the First Preferred Embodiment By thus carrying out the second heat treatment, oxygen atoms were re-introduced into the Cu(I)—O basal plane of the oxide superconductive film. Accordingly, in the heat-treated $YBa_2Cu_3O_{7-x}$ oxide superconductive film, the oxygen deficiency "x" was adjusted to be 0.1 or less (i.e., "x"$\leq 0.1$). Specifically, the oxide superconductive film was again put back into an orthorhombic system.

Figure 6:
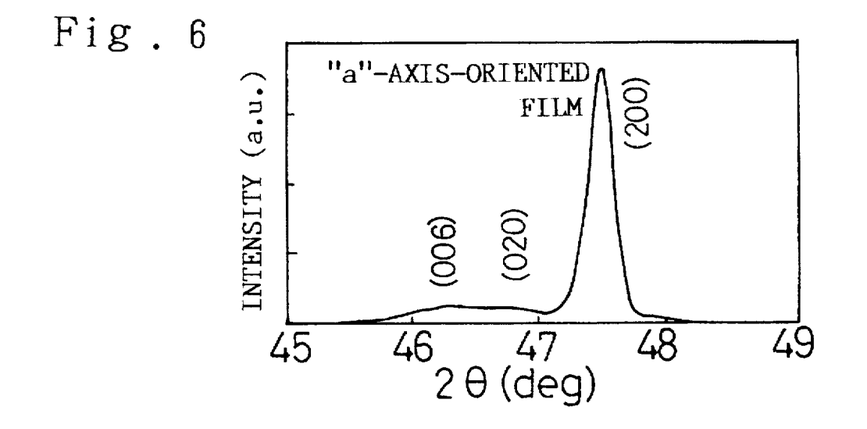
FIG. 6 is an X-ray diffraction chart on an oxide superconductive film, which was subjected to first and second heat treatments of a crystalline orientation controlling process according to a Second Preferred Embodiment of the present invention.

The thus heat-treated oxide superconductive film was subjected to an X-ray diffraction analysis. FIG. 6 illustrates an X-ray diffraction chart on the heat-treated film, which underwent the first and second heat treatments. As can be appreciated from FIG. 6, there arise a high-intensity peak, which results from (200) plane, and a low-intensity peak, which results from (006) plane, a low-intensity peak, which results from (020) plane. This fact implies that the heat-treated oxide superconductive film was of extremely high "a"-axis orientation. In other words, the heat-treated film, which were prepared by the Second Preferred Embodiment, was in an area designated at "PC" of FIG. 5, where it was subjected to the first heat treatment of 500° C.

In the Second Preferred Embodiment, the "b"-axis-oriented oxide superconductive film, which was prepared by the First Preferred Embodiment, was subjected to the first heat treatment. It is naturally possible to subject an oxide superconductive film, in which "a"-axis orientation and "b"-axis orientation coexist, to the first heat treatment.

Note that, in the First and Second Preferred Embodiments as well as Comparative Example No. 1 and the experiment, the oxygen deficiencies were evaluated by an iodine titration method. For example, an oxygen superconductive bulk was examined for its oxygen amount by an iodine titration. The oxygen deficiency of an oxygen superconductive film was derived from the relationship between the oxygen amount and the length of "a", "b" and "c"-axes.

(Mechanism)

It is still under investigation what mechanism produces the advantages effected by the First and Second Preferred Embodiments. It is assumed as hereinafter described.

Figure 7:
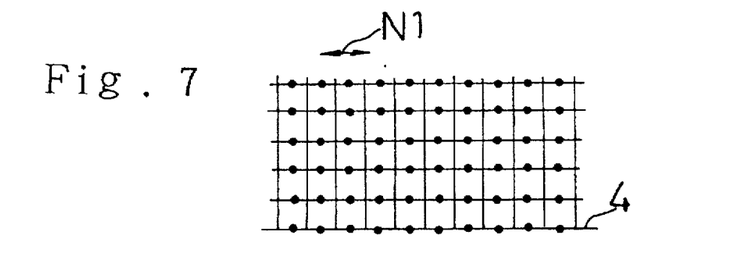
FIG. 7 is a schematic construction diagram for schematically illustrating an "a"-axis-oriented oxide superconductive film.
Figure 8:
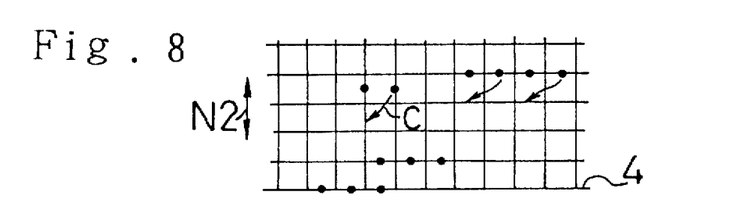
FIG. 8 is a schematic construction diagram for schematically and imaginarily illustrating an "a"-axis-oriented oxide superconductive film, which is being subjected to a first heat treatment.
Figure 9:
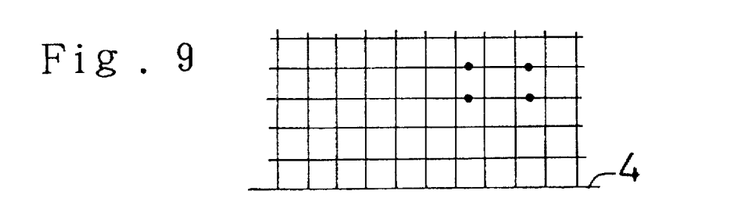
FIG. 9 is a schematic construction diagram for schematically and imaginarily illustrating an "a"-axis-oriented oxide superconductive film, which has undergone a first heat treatment.
Figure 10:
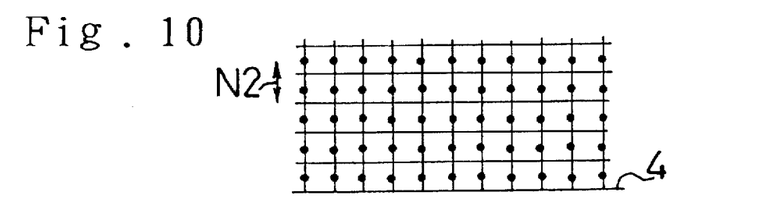
FIG. 10 is a schematic construction diagram for schematically illustrating a "b"-axis-oriented oxide superconductive film.
Figure 11:
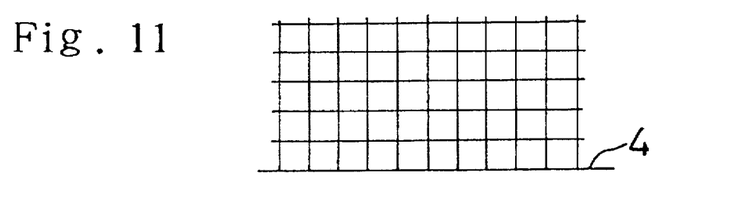
FIG. 11 is a schematic construction diagram for schematically and imaginarily illustrating a "b"-axis-oriented oxide superconductive film, which has undergone a first heat treatment.

FIGS. 7 through 11 illustrate a series of arrangement processes of oxygen atoms in the Cu(I)—O basal plane of YBCO. FIGS. 7, 8, 9 and 10 schematically exemplify the processes according to the First Preferred Embodiment in this order. FIGS. 10, 11 and 7 schematically exemplify the processes according to the Second Preferred Embodiment in this order. In FIGS. 7 through 11, Cu(I) atoms are disposed at the crossing points, and oxygen (O) atoms are designated at the mark, .

FIG. 7 schematically illustrates an arrangement in the "as grown" film, which was prepared by the photo-irradiation MOCVD process in the First Preferred Embodiment. In the "as-grown" film, the oxygen atoms, which were disposed between the Cu atoms, were arranged parallelly to the substrate 4 (i.e., in the direction of arrow "N1"), thereby disposing "b"-axis in the direction of arrow "N1". Accordingly, in the arrangement illustrated in FIG. 7, the direction being perpendicular to the substrate 4 was taken as "a" and the direction being parallel to the substrate 4 is taken as "b"-axis. The axial length of "b"-axis is longer than that of "a"-axis, because the oxygen atoms were arranged in the direction of arrow "N1". Thus, the "as-grown" film having the arrangement shown in FIG. 7 was an "a"-axis-oriented film.

FIG. 8 schematically illustrates an arrangement in the "as-grown" film, which was being subjected to the first heat treatment. It is assumed that, in this arrangement, the oxygen atoms were moving in the direction of arrow "C1", and were trying to re-arrange in the direction being perpendicular to the substrate 4 (i.e., in the direction of arrow "N2"). Accordingly, it is believed that, when causing the oxygen deficiency in the "a"-axis-oriented film, the oxygen atoms were stabilized energetically in the direction being perpendicular to the substrate 4.

In the arrangement illustrated in FIG. 9, the arrangement shown in FIG. 8 was further proceeded. Specifically, FIG. 8 schematically illustrates an arrangement in the oxide superconductive film, which was gone through the first heat treatment, and whose oxygen deficiency was increased (e.g., $0.4 \leq$"x"$<0.8$). It is believed that, in this arrangement, the oxygen atoms resided, but were arranged in the direction being perpendicular to the substrate 4 (i.e., in the direction of arrow "N2") so as to constitute cores for arranging the oxygen atoms in the direction being perpendicular to the substrate 4.

FIG. 10 schematically illustrates an arrangement in the oxide perconductive film, which was being subjected to the second heat treatment after the first heat treatment, and into which oxygen atoms were re-introduced. It is believed that, in this arrangement, the oxygen atoms were re-arranged in the direction being perpendicular to the substrate 4 (i.e., in the direction of arrow "N2"). Thus, it is assumed that "b"-axis was disposed perpendicular to the substrate 4, thereby producing a "b"-axis-oriented film. In this arrangement, the oxygen deficiency "x" was adjusted to "x"$\leq 0.1$ by re-introducing the oxygen atoms.

When the arrangement of the "b"-axis-oriented film shown in FIG. 10 was re-subjected to the first heat treatment, the major proportion of the oxygen atoms in the "b"-axis-oriented film were depleted by heat.

FIG. 11 schematically illustrates an arrangement in the oxide superconductive film, whose oxygen atoms were depleted so that the oxygen deficiency "x" fell in a range, $0.8 \leq$"x"$\leq 1.0$. It is believed that the film having this arrangement was transformed into or could be approximated to an tetragonal system, because the length of "b"-axis was virtually reduced to that of "a"-axis by depleting the oxygen atoms.

When the film shown in FIG. 11 was re-subjected to the second heat treatment to re-introduce the oxygen atoms, the arrangement of the film is put back into the arrangement shown in FIG. 7. Thus, the oxygen atoms were re-arranged in the direction being parallel to the substrate 4 (i.e. in the direction of arrow "N1"). Thus, an "a"-axis-oriented film was re-produced. It is assumed that, when the oxygen deficiency was increased to be $0.8 \leq$"x"$\leq 1.0$ and thereafter the oxygen atoms were re-introduced into the "a"-axis-oriented film, the oxygen atoms were likely to re-arrange in the direction being parallel to the substrate 4.

Figure 12:
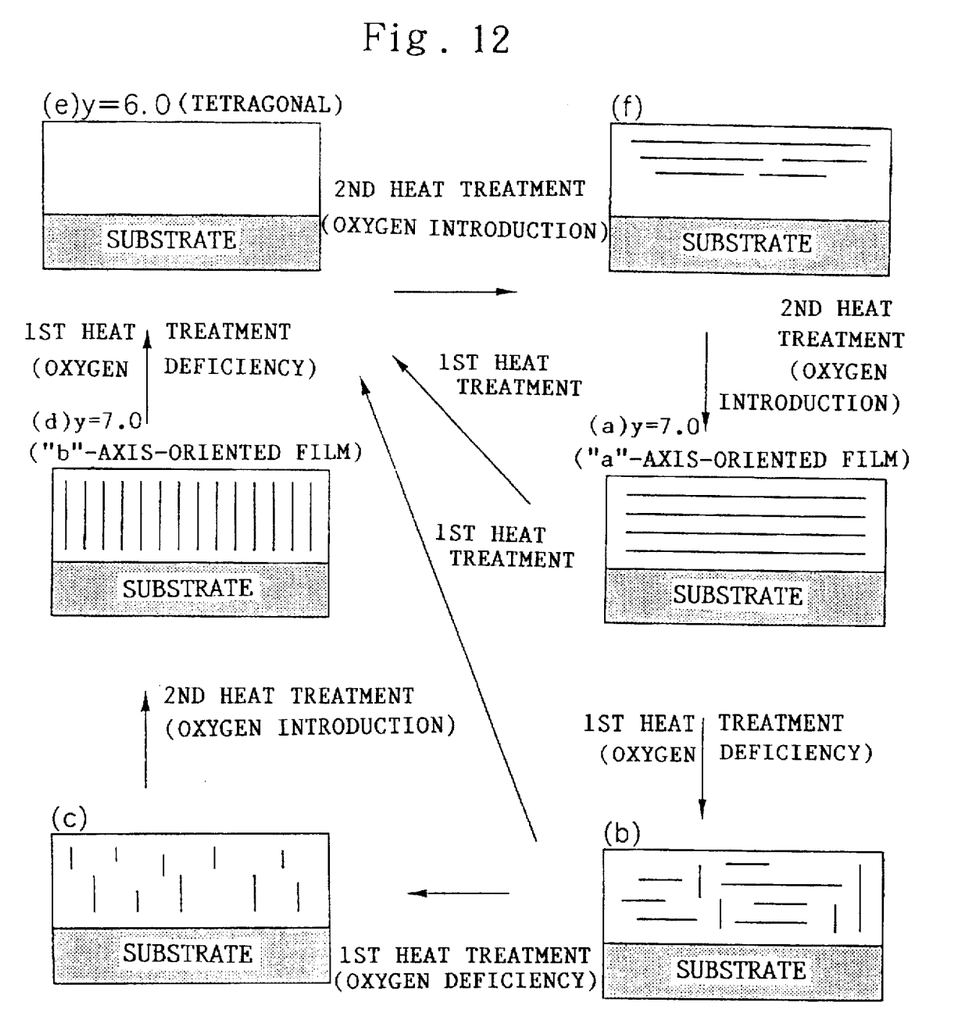
FIG. 12 is a schematic construction diagram for schematically illustrating transformation processes of crystalline orientation, which an oxide superconductive film undergoes.

With reference to FIGS. 12 (a) through (f), the above-described $YBa_2Cu_3O_{y-x}$ oxide superconductive film will be further described for verifying the mechanism of the crystalline orientation in detail. FIG. 12 (a) corresponds to FIG. 7, and illustrates an "a"-axis-oriented film (i.e., y=0.7). When the film illustrated in FIG. 12 (a) is subjected to the first heat treatment, it is transformed into a film illustrated in FIG. 12 (b) by the oxygen deficiency. When the film illustrated in FIG. 12 (b) is further subjected to the first heat treatment, it is transformed into a film illustrated in FIG. 12 (c) by the increasing oxygen deficiency. Finally, when the film illustrated in FIG. 12 (c) is subjected to the second heat treatment to re-introduce oxygen atoms, the film is transformed into a "b"-axis-oriented film illustrated in FIG. 12 (d) (i.e., y=7.0). Note that FIG. 12 (d) corresponds to FIG. 10.

Moreover, when the "b"-axis-oriented film illustrated in FIG. 12 (d) is further subjected to the first heat treatment to increase the oxygen deficiency "x", it is transformed into a tetragonal film illustrated in FIG. 12 (e) (e.g., y=6.0). When the film illustrated in FIG. 12 (e) is subjected to the second heat treatment to re-introduce oxygen atoms, the "a"-axis-oriented film illustrated in FIG. 12 (a) is re-produced by way of an intermediate film illustrated in FIG. 12 (f).

To summarize, when the films illustrated in FIGS. 12 (a) and (b) are subjected to the first heat treatment to increase the oxygen deficiency, for instance, to decrease the value "y" to 6.0 (i.e. y=6.0), they are transformed into the film illustrated in FIG. 12 (e). Moreover, as mentioned earlier, when the film illustrated in FIG. 12 (e) is further subjected to the second heat treatment to re-introduce oxygen atoms, the film is transformed back into the film illustrated in FIG. 12 (a) by way of the intermediate film illustrated in FIG. 12 (f).

MODIFIED VERSIONS OF THE FIRST AND SECOND PREFERRED EMBODIMENTS

In the First and Second Preferred Embodiments described above, the first heat treatment was carried out in nitrogen atmosphere, but the present invention is not limited to this arrangement. For example, the first heat treatment can be carried out in vacuum, or in non-oxidizing atmosphere like argon atmosphere, because it is aimed at depleting oxygen atoms by heat.

In the First and Second Preferred Embodiments, the temperature and time required for the first heat treatment depend on the pressure of the atmosphere during the first heat treatment and the composition of the oxide superconductive film. For instance, when the pressure of the atmosphere during the first heat treatment is high, it is believed that oxygen atoms are less likely to separate from oxide superconductive film. Accordingly, if such is the case, it is preferred to increase the temperature of the first heat treatment to elevated temperatures, or to prolong the time for the first heat treatment. However, when the temperature of the first heat treatment is excessively high, there is a fear for thermally decomposing the film. When the time for the first heat treatment is extended to long, such a treatment results in decreased productivity. Further, when the thickness of oxide superconductive film is too thick, it is believed that it takes longer for oxygen atoms to move in the film. Furthermore, when transforming an "a"-axis-oriented oxide superconductive film to a "b"-axis-oriented superconductive film, or when transforming an oxide superconductive film, in which "a"-axis and "b" axis coexist, to a "b"-axis-oriented film, it is necessary to take the characteristic curve "A" (i.e., the "b"-axis orientation depends greatly on the temperature of the first heat treatment) into consideration.

Thus, when determining the temperature of the first heat treatment, it is preferred to take the aforementioned factors into consideration. Specifically, in the First Preferred Embodiment, the temperature of the first heat treatment depends on the composition of oxide superconductive film, the atmosphere for the first heat treatment, and the like. Let us assume that the first heat treatment can be carried out over a wide temperature range, it is believed that the upper limit of the first heat treatment temperature can be adjusted to 550° C., 500° C., 450° C., and 400° C. Similarly, it is believed that the lower limit of the first heat treatment temperature can be adjusted to 200° C., 250° C., 300° C., 350° C., and 400° C. It is also believed that the temperature of the second heat treatment can be varied in these ranges.

Likewise, in the Second Preferred Embodiment, the temperature of the first heat treatment depends on the composition of oxide superconductive film, the atmosphere for the first heat treatment, and the like. Let us assume that the first heat treatment can be carried out over a wide temperature range, it is believed that the upper limit of the first heat treatment temperature can be adjusted to 800° C., 750° C., 700° C., 650° C., and 600° C. Similarly, it is believed that the lower limit of the first heat treatment temperature can be adjusted to 400° C., and 450° C. It is also believed that the temperature of the second heat treatment can be varied in these ranges.

Note that, in the Second Preferred Embodiment for producing the "a"-axis-oriented oxide superconductive film, the first heat treatment is carried out at a temperature higher than that of the First Preferred Embodiment for producing the "b"-axis-oriented oxide superconductive film.

In the First and Second Preferred Embodiments described above, the YBCO oxide superconductive film was subjected to the first and second heat treatments, but the present invention is not limited to this arrangement. For example, lanthanide elements (free from Ce and Pm) can substitute part of Y in the chemical formula, and strontium (Sr) can substitute part of Ba therein.

In the First and Second Preferred Embodiments described above, the "as-grown" oxide superconductive film was prepared by the photo-irradiation MOCVD process, but the present invention is not limited tothis arrangement. For instance, it is possible to prepare the "as-grown" oxide superconductive film by a CVD process, a laser abrasion process, a molecular beam epitaxy (MBE) process, and a sputtering process, which have been utilized so far.

In the First and Second Preferred Embodiments described above, the oxide superconductive films were prepared on the substrate 4, which comprised MgO, but the present invention is not limited to this arrangement. For example, it is possible to employ at least one material selected from the group consisting of $SrTiO_3$, $NdGaO_3$, $LaAlO_3$, and $LaGaO_3$, which have been known to be appropriate for forming oxide superconductive film thereon.

In the First and Second Preferred Embodiments described above, the "as-grown" oxide superconductive film was prepared in a thickness of 200 nm (i.e., 0.2 μm), but the present invention is not limited to this arrangement For instance, the "as-grown" film can be formed as an extremely-thin film, a thin film or a thick film. For example, the "as-grown" oxide superconductive film can be preferably prepared in a thickness of from $1.0 \times 10^{-3}$ μm (i.e., 10 Å) to 200 μm, further preferably from $1.0 \times 10^{-3}$ μm to 100 μm. If necessary, the "as-grown" oxide superconductive film can be prepared in a thickness of 200 μm or more.

In the First and Second Preferred Embodiments described above, the second heat treatment was carried out in oxygen-rich atmosphere. The term "oxygen-rich atmosphere" means molecular oxygen atmosphere, atomic oxygen atmosphere, ozone atmosphere, or $NO_2$ atmosphere, which has been known and used to prepare oxide superconductive film so far. The second heat treatment of the present invention can be carried out in one of these atmospheres.

Having now fully described the present invention, it will be apparent to one of ordinary skill in the art that many changes and modifications can be made thereto without departing from the spirit or scope of the present invention as set forth herein including the appended claims.

What is claimed is:

1. A process for controlling crystalline orientation of an oxide superconductive film having a "c"-axis parallel to a substrate by subjecting the oxide superconductive film to heat treatment, the process comprising the steps of:

carrying out a first heat treatment, in which the oxide superconductive film is heated and held in a non-oxidizing atmosphere so as to cause a partial oxygen deficiency in the oxide superconductive film; and carrying out a second heat treatment, in which the oxide superconductive film subjected to the first treatment is heated and held in an oxygen-rich atmosphere so as to reintroduce oxygen into the oxide superconductive film and alter the crystalline orientation of the oxide superconductive film to either an "a"-axis orientation or a "b"-axis orientation, depending upon the level of the partial oxygen deficiency caused in the first heat treatment, the film having the "c"-axis parallel to the substrate.

2. The process according to claim 1, wherein said first heat treatment is carried out in a temperature range of from at least one lower temperature limit selected from the group consisting of 200° C., 250° C., 300° C., 350° C., and 400° C., to at least one upper temperature limit selected from the group consisting of 550° C., 500° C., 450° C., and 400° C.

3. The process according to claim 1, wherein said first heat treatment is carried out in a temperature range of from at least one lower temperature limit selected from the group consisting of 400° C., and 450° C., to at least one upper temperature limit selected from the group consisting of 800° C., 750° C., 700° C., 650° C. and 600° C.

4. The process according to claim 1, wherein said first heat treatment is carried out in non-oxidizing atmosphere which is at least one atmosphere selected from the group consisting of nitrogen atmosphere, vacuum, and argon atmosphere.

5. The process according to claim 1, wherein said second heat treatment is carried out in oxygen-rich atmosphere which is at least one selected from the group consisting of molecular oxygen atmosphere, atomic oxygen atmosphere, ozone atmosphere, and $NO_2$ atmosphere.

6. The process according to claim 1, wherein the oxide superconductive film is formed by at least one process selected from the group consisting of a photo-irradiation MOCVD process, a CVD process, a laser ablation process, a molecular beam epitaxy (MBE) process, and a sputtering process.

7. The process according to claim 6, using the photo-irradiation MOCVD process which is carried out as to form an oxide superconductive film while scanning the oxide superconductive film with an ArF excimer laser, so as to prepare an "as grown" oxide superconductive film which has the "c"-axis parallel to the substrate and exhibits "a"-axis orientation.

8. The process according to claim 1, wherein the oxide superconductive film is expressed by the chemical formula, $YBA_2Cu_3O_{7-x}$, in which "x" represents oxygen deficiency.

9. The process according to claim 1, wherein the oxide superconductive film is formed on a substrate which comprises at least one material selected from the group consisting of MgO, $SrTiO_3$, $NdGaO_3$, $LaAlO_3$, and $LaGaO_3$.

10. The process according to claim 1 further including a step of selecting an oxide superconductive film having a thickness of from $1.0 \times 10^{-3}$ µm to 200 µm.

11. A process for controlling crystalline orientation of an oxide superconductive film, the process comprising the steps of:

forming an oxide superconductive film on a substrate, the oxide superconductive film being expressed by the chemical formula, $LM_2Cu_3O_{7-x}$, in which "L" is at least one element selected from the group consisting of Y and lathanide elements free from Ce and Pm, and "M" is at least one element selected from the group consisting of Ba and Sr, the oxide superconductive film having a "c"-axis which is parallel to the substrate;

carrying out a first heat treatment, in which the oxide superconductive film is heated and held in a non-oxidizing atmosphere, so as to cause a partial oxygen deficiency "x" in the oxide superconductive film which oxygen deficiency "x" is $0.4 \leq$ "x" $< 0.8$; and carrying out a second heat treatment, in which the oxide superconductive film subjected to the first heat treatment is heated and held in an oxygen-rich atmosphere, so as to reintroduce oxygen into the oxide superconductive film and prepare a "b"-axis-oriented oxide superconductive film "c-"axis parallel to the substrate.

12. The process according to claim 11, wherein said first heat treatment is carried out in a temperature range of from 300° to 450° C., and the "b"-axis orientation of the resulting oxide superconductive film is 70% or more after the second heat treatment.

13. The process according to claim 11, wherein the oxygen deficiency "x" is $0.6 \leq$ "x" $< 0.8$ after the first heat treatment.

14. The process according to claim 11, the oxygen deficiency "x" is "x" $\leq 0.1$ after the second heat treatment.

15. The process according to claim 11, wherein said first heat treatment is carried out in a temperature range of from at least one lower temperature limit selected from the group consisting of 200° C., 250° C., 300° C., 350° C., and 400° C., to at least one upper temperature limit selected from the group consisting of 550° C., 500° C., 450° C., and 400° C.

16. The process according to claim 11, wherein said first heat treatment is carried out in a non-oxidizing atmosphere which is at least one atmosphere selected from the group consisting of nitrogen atmosphere, vacuum, and argon atmosphere.

17. The process according to claim 11, wherein said second heat treatment is carried out in an oxygen-rich atmosphre which is at least one selected from the group consisting of molecular oxygen atmosphere, atomic oxygen atmosphere, ozone atmosphere, and $NO_2$ atmosphere.

18. The process according to claim 11, wherein said oxide-superconductive-film forming step is carried out by at least one process selected from the group consisting of a photo-irradiation MOCVD process, a CVD process, a laser ablation process, a molecular beam epitaxy (MBE) process, and a sputtering process.

19. The process according to claim 11, wherein, in said oxide-superconductive-film forming step, the oxide superconductive film is formed on a substrate which comprises at least one material selected from the group consisting of MgO, $SrTiO_3$, $NdGaO_3$, $LaAlO_3$, and $LaGaO_3$.

20. The process according to claim 11, wherein, in said oxide-superconductive-film forming step, the oxide superconductive film is formed in a thickness of from $1.0 \times 10^{-3}$ µm to 200 µm.

21. A process for controlling crystalline orientation of an oxide superconductive film, the process comprising the steps of:

forming an oxide superconductive film on a substrate, the oxide superconductive film being expressed by the chemical formula, $LM_2Cu_3O_{7-x}$, in which "L" is at least one element selected from the group consisting of Y and lathanide elements free from Ce and Pm, and "M" is at least one element selected from the group consisting of Ba and Sr, the oxide superconductive film having a "c"-axis which is parallel to the substrate;

carrying out a first heat treatment, in which the oxide superconductive film is heated and held in non-oxidizing atmosphere, to cause a partial oxygen deficiency "x" in the oxide superconductive film which oxygen deficiency "x" is $0.8 \leq$ "x" $\leq 1.0$; and carrying out a second heat treatment, in which the oxide superconductive film subjected to the first treatment is heated and held in an oxygen-rich atmosphere, to reintroduce oxygen into the oxide superconductive film and prepare an "a"-axis-oriented oxide superconductive film having the "c"-axis parallel to the substrate.

22. The process according to claim 21, wherein the oxygen deficiency "x" is "x" ≤0.1 after the second heat treatment.

23. The process according to claim 21, Wherein said first heat treatment is carried out in a temperature range of from at least one lower temperature limit selected from the group consisting of 400° C., and 450° C., to at least one upper temperature limit selected from the group consisting of 800° C., 750° C., 700° C., 650° C. and 600° C.

24. The process according to claim 21, wherein said second heat treatment is carried out in an oxygen-rich atmosphere, which is at least one atmosphere selected from the group consisting of nitrogen atmosphere, vacuum, and argon atmosphere.

25. The process according to claim 21, wherein said second heat treatment is carried out in an oxygen-rich atmosphere which is at least one selected from the group consisting of molecular oxygen atmosphere, atomic oxygen atmosphere, ozone atmosphere, and $NO_2$ atmosphere.

26. The process according to claim 21, wherein said oxide-superconductive-film forming step is carried out by at least one process selected from the group consisting of a photo-irradiation MOCVD process, a CVD process, a laser ablation process, a molecular beam epitaxy (MBE) process, and a sputtering process.

27. The process according to claim 21, wherein, in said oxide-superconductive-film forming step, the oxide superconductive film is formed on a substrate which comprises at least one material selected from the group consisting of MgO, $SrTiO2_3$, $NdGaO_3$, $LaAlO_3$, and $LaGaO_3$.

28. The process according to claim 21, wherein, in said oxide-superconductive-film forming step, the oxide superconductive film is formed in a thickness of from $1.0 \times 10^{-3}$ μm to 200 μm.

* * * * *